United States Patent [19]
Kikuda et al.

[11] Patent Number: 4,931,668
[45] Date of Patent: Jun. 5, 1990

[54] MIS TRANSISTOR DRIVEN INVERTER CIRCUIT CAPABLE OF INDIVIDUALLY CONTROLLING RISING PORTION AND FALLING PORTION OF OUTPUT WAVEFORM

[75] Inventors: Shigeru Kikuda; Michihiro Yamada; Hiroshi Miyamoto, all of Hyogo, Japan

[73] Assignee: Mitsubishi Denki Kabushiki Kaisha, Tokyo, Japan

[21] Appl. No.: 143,399

[22] Filed: Jan. 13, 1988

[30] Foreign Application Priority Data

Jan. 16, 1987 [JP] Japan .................................. 62-8669

[51] Int. Cl.⁵ .................... H03K 17/16; H03K 19/094
[52] U.S. Cl. .................................... 307/443; 307/451; 307/263; 307/268
[58] Field of Search ............... 307/443, 448, 451, 261, 307/263, 268, 290, 292

[56] References Cited

U.S. PATENT DOCUMENTS 4,115,740  9/1978  Yoshido ........................... 307/263
4,365,316  12/1982 Iwahashi et al. .................. 307/448

FOREIGN PATENT DOCUMENTS 293016 12/1985 Japan .

Primary Examiner—Andrew J. James
Assistant Examiner—Margaret Rose Wambach
Attorney, Agent, or Firm—Lowe, Price, LeBlanc, Becker & Shur

[57] ABSTRACT

A resistor is connected to an input portion of a CMOS inverter. An input of the CMOS inverter is affected by a time constant of an RC circuit comprising the resistor and gate stray capacitance of the CMOS inverter. In addition, there is provided an n channel MOS transistor having a drain and a source connected to both ends of the resistor, respectively, and a gate connected to an input signal source. Only in the rising portion of an input signal, the n channel MOS transistor is turned on, so that the resistor is bypassed. Thus, a waveform of output of the CMOS inverter is not delayed at the falling portion. Only at the rising portion, the waveform thereof is delayed due to the time constant of the above described RC circuit.

6 Claims, 11 Drawing Sheets

MIS TRANSISTOR DRIVEN INVERTER CIRCUIT CAPABLE OF INDIVIDUALLY CONTROLLING RISING PORTION AND FALLING PORTION OF OUTPUT WAVEFORM

BACKGROUND OF THE INVENTION

1. Field of the Invention

The present invention relates to an inverter circuit and more particularly, to an inverter circuit comprising an MIS (Metal Insulator Semiconductor) transistor capable of individually controlling the rising portion and falling portion of an output waveform by selectively bypassing a resistor connected to an input portion of the inverter circuit.

2. Description of the Prior Art

Conventionally, to various timing signals have been used, for example, drive each element of a dynamic random access memory (for example, a sense amplifier) or drive a sequential logic circuit precisely. In such an apparatus, in order to form a timing signal having a desired waveform for a particular application, processing such as delay is performed with respect to an input signal having a predetermined waveform. Such a waveform control apparatus includes an apparatus in which a limiter circuit is connected to an input portion of an inverter so that an output signal of the inverter is delayed. Such a circuit arrangement disclosed in Japanese Patent Laying-Open Gazette No. 293016/1986.

Furthermore, conventionally, apparatus has been used in which the values of a resistor and a capacitor, connected to an input portion or an output portion of an inverter circuit comprising an MIS transistor such as an MOS (Metal Oxide Semiconductor) transistor, are selected so that a waveform of output of the inverter is controlled. FIG. 1 is a circuit diagram showing an example thereof.

Referring to FIG. 1, a conventional inverter circuit comprising an MOS transistor comprises an input terminal A to which an input signal Vin 1 having a predetermined waveform is inputted, a CMOS (Complementary MOS) inverter 1 having a predetermined threshold value, a resistor 2 connected between a node B (a signal Vin2) corresponding to an input of the CMOS inverter 1 and the above described input terminal A, and an output terminal C from which an output signal Vout of the CMOS inverter 1 is outputted. More specifically, the CMOS inverter 1 comprises a p channel MOS transistor Q1 having a source connected to a power-supply voltage $V_{cc}$, a drain connected to the output terminal C and a gate connected to the node B, and an n channel MOS transistor Q2 having a drain connected to the output terminal C, a source connected to a ground potential and a gate connected to the node B.

FIG. 2 is a waveform diagram for explaining operation of the inverter circuit shown in FIG. 1, where the axis of abscissa represents the time and the axis of ordinate represents a voltage level. In FIG. 2, a solid line A represents a voltage waveform of the signal Vin1 at the input terminal A shown in FIG. 1, a dotted line B represents a voltage waveform of the signal Vin2 at the node B shown in FIG. 1, and a dash and dot line C represents a voltage waveform of the signal Vout at the output terminal C shown in FIG. 1.

An RC circuit having a time constant determined by the resistor 2 and gate stray capacitance of the CMOS inverter 1 is formed in the input portion of the CMOS inverter 1 shown in FIG. 1. When the signal Vin1 is applied to the input terminal A, a waveform of the signal Vin2 at the point B rises and falls slowly, as represented by the dotted line B shown in FIG. 2. As a result, the signal Vout at the output terminal C has a waveform as represented by the dash and dot line C shown in FIG. 2. More specifically, as seen from comparison of the lines A and B shown in FIG. 2, the rising portion and the falling portion of the input signal become slower due to a time constant RC, so that both the falling portion and the rising portion of the output signal Vout of the CMOS inverter 1 are delayed.

FIG. 3 is a diagram showing another example of the conventional inverter, and FIG. 4 is a waveform diagram for explaining operation thereof. In FIG. 4, a solid line A represents a voltage waveform of a signal Vin at an input terminal A shown in FIG. 3, and a dash and dot line C represents a voltage waveform of a signal Vout at an output terminal C. The inverter circuit shown in FIG. 3 differs from the inverter circuit shown in FIG. 1 in that the resistor 2 is not provided. Instead, a capacitor Cl is connected between the output terminal C of the CMOS inverter 1 and a ground potential. Both the falling portion and the rising portion of a voltage Vout (represented by a dash and dot line C shown in FIG. 4) between both ends of the capacitor Cl are delayed due to discharging and charging of the capacitor Cl. As described above, in the conventional inverter circuit, the resistance value and the capacitance value in an input portion, as in FIG. 1, or an output, as in FIG. 3 portion of the CMOS inverter 1 can be suitably selected so that the rising portion and the falling portion of an output waveform are controlled, whereby a desired timing signal is obtained.

Meanwhile, in the above described inverter circuits shown in FIGS. 1 and 3, if the resistance value and the capacitance value are changed, both the rising portion and the falling portion of the output waveform are delayed, so that the rising portion and the falling portion cannot be individually controlled.

An inverter circuit for differentially delaying the rising portion and the falling portion of an output waveform has been proposed. FIG. 5 is a circuit diagram showing an example thereof, and FIG. 6 is a waveform diagram for explaining operation of the circuit shown in FIG. 5. In the inverter circuit shown in FIG. 5, an n channel MOS capacitor C2 is connected between an output terminal C of a CMOS inverter 1 and a ground potential. More specifically, the gate of the n channel MOS transistor C2 corresponds to an output portion of the n channel MOS capacitor, and the source and drain thereof corresponds to a ground portion of the n channel MOS capacitor. While a voltage more than Vth is applied to the output terminal (during time periods represented by "a" in FIG. 6), the n channel MOS capacitor C2 has capacitance. This is because a channel is formed under the gate of the n channel MOS transistor. On the other hand, while the voltage more than Vth is not applied, such a channel is not formed, so that the n channel MOS capacitor C2 does not have capacitance. More specifically, in FIG. 6, in the rising portion of an input signal Vin (represented by a solid line A), the n channel MOS capacitor C2 has capacitance depending on the output level more than Vth of the CMOS inverter 1 during the time period a, so that the falling portion of an output Vout (represented by a dash and dot line C) is substantially delayed. On the other hand, in the falling portion of the input signal Vin (represented by a solid line A), the n channel MOS capacitor C2 first does not have capacitance, so that the rising portion of the output Vout (represented by a dash and dot line C) is not so delayed. However, after the voltage at the output terminal exceeds Vth (during the time period a), the output waveform is delayed.

FIG. 7 is a diagram showing another example of an inverter circuit for differentially delaying the rising portion and the falling portion of an output waveform, and FIG. 8 is a waveform diagram for explaining operation thereof. The inverter circuit shown in FIG. 7 is the same as the inverter circuit shown in FIG. 5 except that the n channel MOS capacitor C2 shown in FIG. 5 is replaced with a p channel MOS capacitor C3. An output portion of the p channel MOS capacitor C3 is formed by to the gate of the p channel MOS transistor, and a portion maintained at a power-supply voltage $V_{cc}$ is formed by the source and the drain of the p channel MOS transistor. Referring to FIG. 8, during a time period represented by "b", the p channel MOS capacitor C3 has capacitance. Thus, in the rising portion of an input signal Vin (represented by a solid line A), the p channel MOS capacitor C3 first does not have capacitance, so that the falling portion of an output Vout (represented by a dash and dot line C) is not so delayed. On the other hand, in the falling portion of the input signal Vin (represented by a solid line A), the p channel MOS capacitor C3 has capacitance during the time period b, so that the rising portion of the output Vout (represented by a dash and dot line C) is substantially delayed. As described above, in the inverter circuit shown in FIGS. 5 and 7, the falling portion and the rising portion of an output waveform can be differentially delayed, respectively.

However, in the inverter circuit shown in FIGS. 5 and 7, in one of the rising portion and the falling portion of an output waveform, which is not desired to be delayed, the MOS capacitor has capacitance through a fraction of the transition period, so that some delay occurs. Such delay cannot be neglected particularly when it is desired to substantially delay the output waveform using the MOS capacitor having large capacitance.

SUMMARY OF THE INVENTION

Therefore, a primary object of the present invention is to provide an inverter circuit capable of individually controlling the rising portion and the falling portion of an output waveform.

Another object is to generate a desired timing signal at an output of an inverter of an integrated circuit by controlling an MIS transistor so that resistance at an input of the inverter is selectively bypassed.

Briefly stated, the inverter circuit according to the present invention comprises inverter means, input signal supplying means, a resistor connected between an input terminal of the inverter means and the input signal supplying means, and an MIS transistor having a source and a drain connected in parallel with of the resistor. The MIS transistor has a gate selectively connected to the input signal supplying means or either of the input terminal and an output terminal of the inverter means. The MIS transistor selectively bypasses the resistor, so that the rising portion and the falling portion of a waveform of signal outputted from the output terminal of the inverter are individually controlled.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 9:
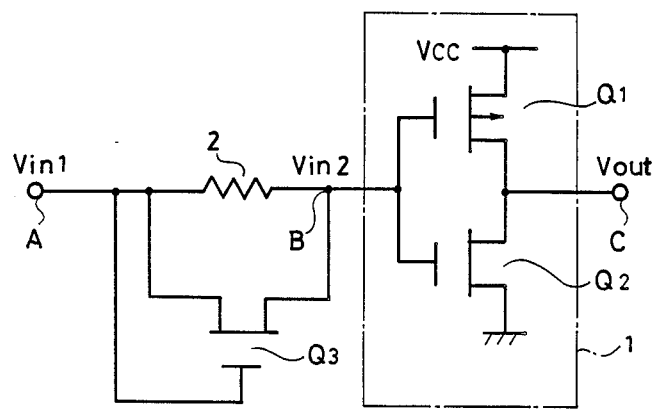
FIG. 9 is a circuit diagram showing an inverter circuit according to a first embodiment of the present invention.

FIG. 9 is a circuit diagram showing an inverter circuit according to a first embodiment of the present invention. The inverter circuit shown in FIG. 9 is the same as the conventional inverter circuit shown in FIG. 1 except that there is provided an n channel MOS transistor Q3 having a drain and a source connected to both ends of a resistor 2, respectively, and a gate connected to an input terminal A. In addition, FIG. 10 is a waveform diagram for explaining operation of the inverter circuit shown in FIG. 9, where a solid line A represents a voltage waveform of a signal Vin1 at the input terminal A shown in FIG. 9, a dotted line B represents a voltage waveform of a signal Vin2 at a node B shown in FIG. 9, and a dash and dot line C represents a voltage waveform of a signal Vout at an output terminal C shown in FIG. 9.

Figure 1:
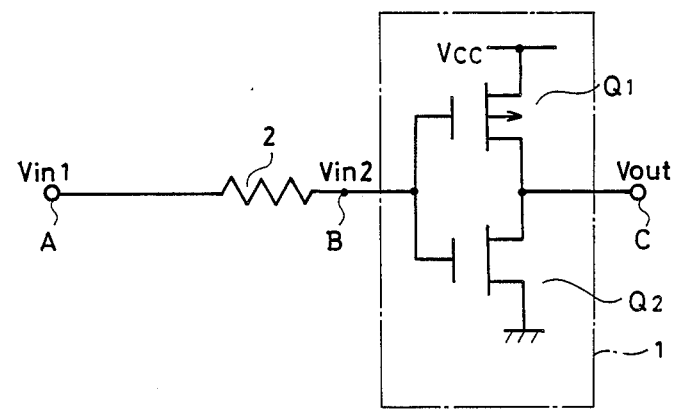
FIG. 1 is a circuit diagram showing an example of a conventional inverter circuit.
Figure 2:
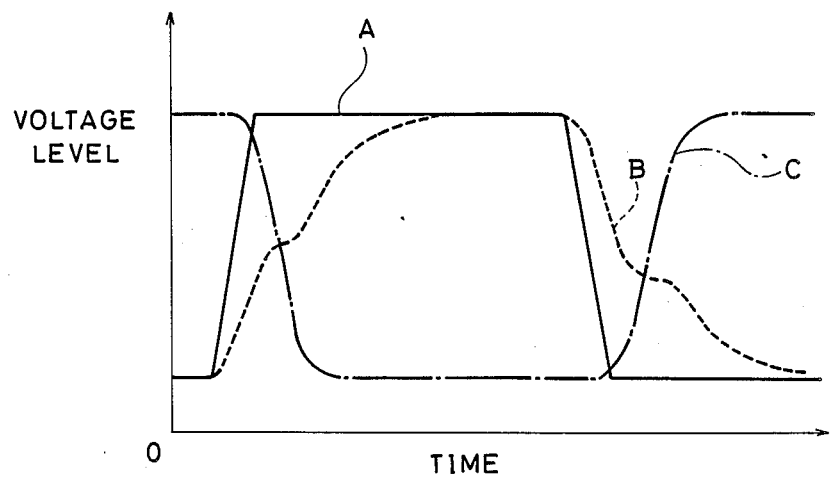
FIG. 2 is a waveform diagram for explaining operation of the inverter circuit shown in FIG. 1.
Figure 3:
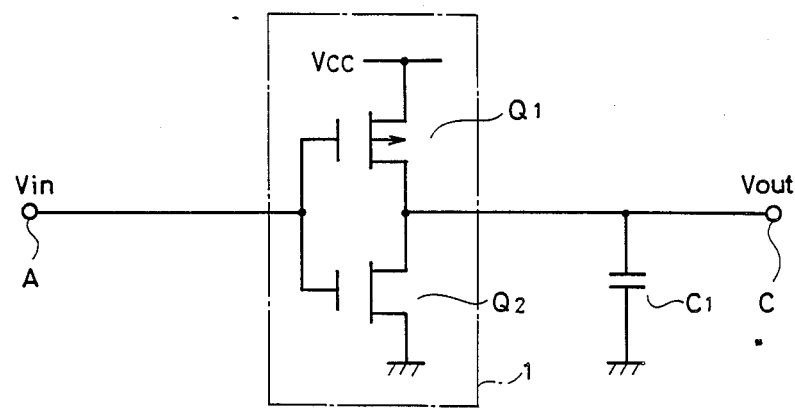
FIG. 3 is a circuit diagram showing another example of a conventional inverter circuit.
Figure 4:
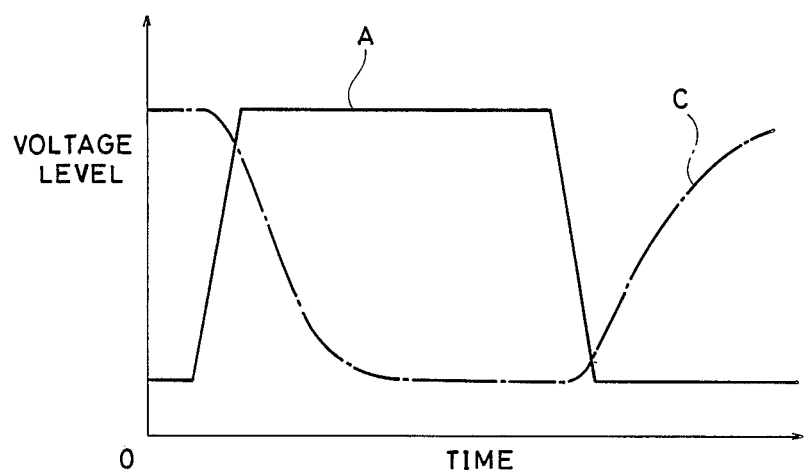
FIG. 4 is a waveform diagram for explaining operation of the inverter circuit shown in FIG. 3.
Figure 5:
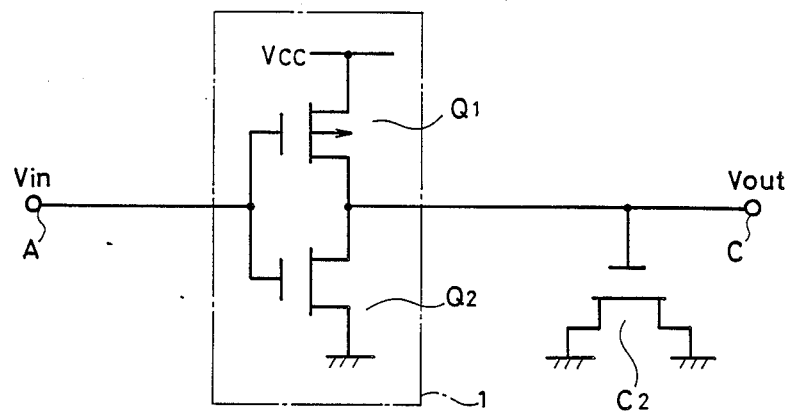
FIG. 5 is a circuit diagram showing still another example of a conventional inverter circuit.
Figure 6:
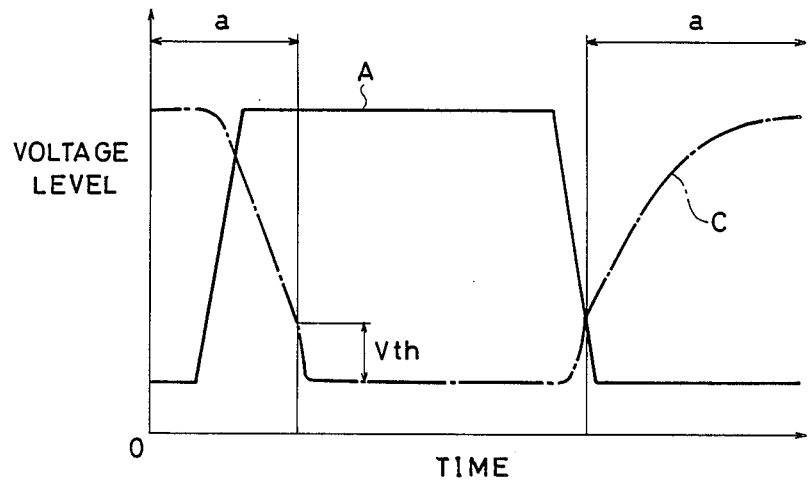
FIG. 6 is a waveform diagram for explaining operation of the inverter circuit shown in FIG. 5.
Figure 7:
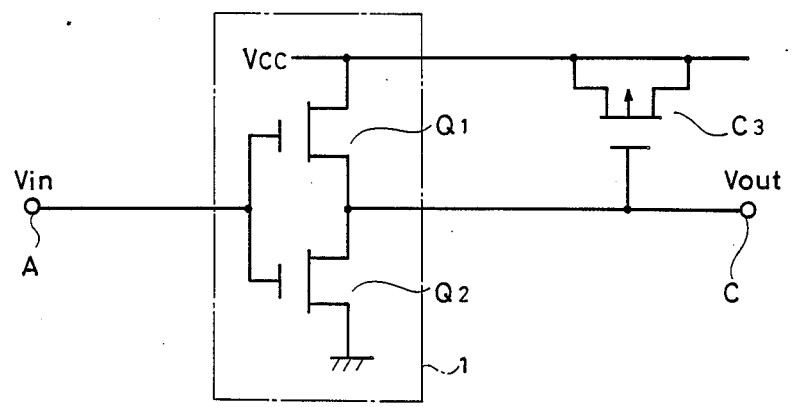
FIG. 7 is a circuit diagram showing a further example of a conventional inverter circuit.
Figure 8:
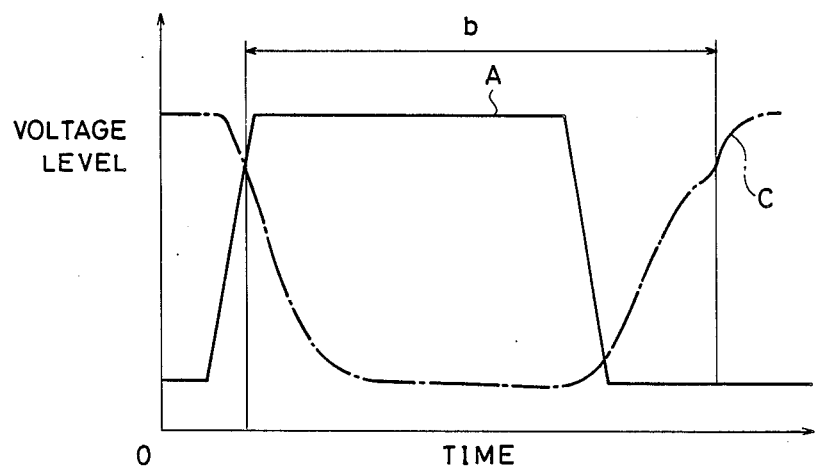
FIG. 8 is a waveform diagram for explaining operation of the inverter circuit shown in FIG. 7.
Figure 10:
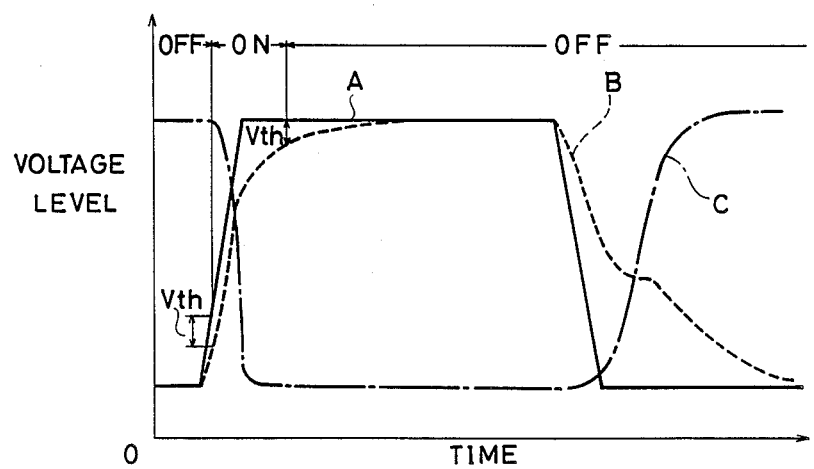
FIG. 10 is a waveform diagram for explaining operation of the inverter circuit shown in FIG. 9.

Referring to FIGS. 9 and 10, when the input signal Vin1 (represented by a solid line A) rises, the signal Vin2 (represented by a dotted line B) first rises slowly due to a time constant of an RC circuit as described with reference to FIGS. 1 and 2.

Assuming that a threshold voltage of the n channel MOS transistor Q3 is Vth, in the rising portion of the input signal (in the case of Vin1>Vin2), the transistor Q3 is turned on if the following condition is satisfied;

gate voltage (Vin1)>threshold value (Vth)+Vin2. Thus, the n channel MOS transistor Q3 is turned on only in a section represented by "ON" in FIG. 10. While the transistor Q3 is on, a bypass is formed in parallel with the resistor 2, so that the signal Vin2 (represented by a dotted line B) rises steeply irrespective of the time constant of the above described RC circuit. Thus, the output signal Vout [represented by a dash and dot line C) falls steeply. Thereafter, when the difference in voltage between the input signals Vin1 and Vin2 is less than Vth, the transistor Q3 is turned off. In addition, in the falling portion of the input signal (in the case of Vin1<Vin2), the transistor Q3 is turned on if the following condition is satisfied;

gate voltage (Vin1)>threshold value (Vth)+Vin1. However, the condition is never satisfied, so that the transistor Q3 remains in the off-state. Thus, in the falling portion of the input signal Vin1, the resistor 2 is not bypassed, so that the falling portion of the signal Vin2 becomes slower due to the time constant of the RC circuit, as in FIG. 2 of a waveform diagram showing the conventional inverter circuit. Thus, the rising portion of the signal Vout (represented by a dash and dot line C) is delayed. More specifically, according to the inverter circuit shown in FIG. 9, the rising portion, only, of a waveform of the output signal Vout can be delayed.

Figure 11:
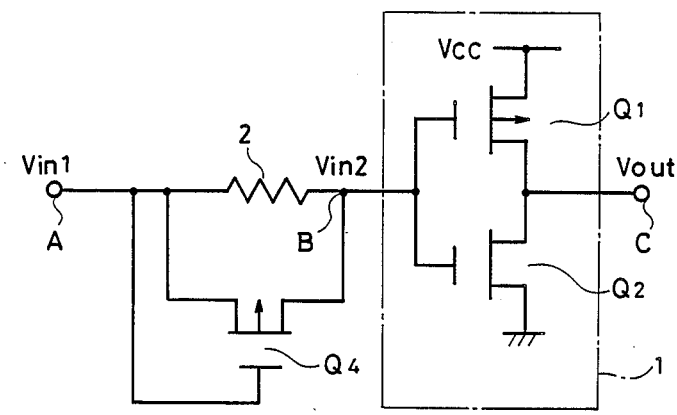
FIG. 11 is a circuit diagram showing an inverter circuit according to a second embodiment of the present invention.
Figure 12:
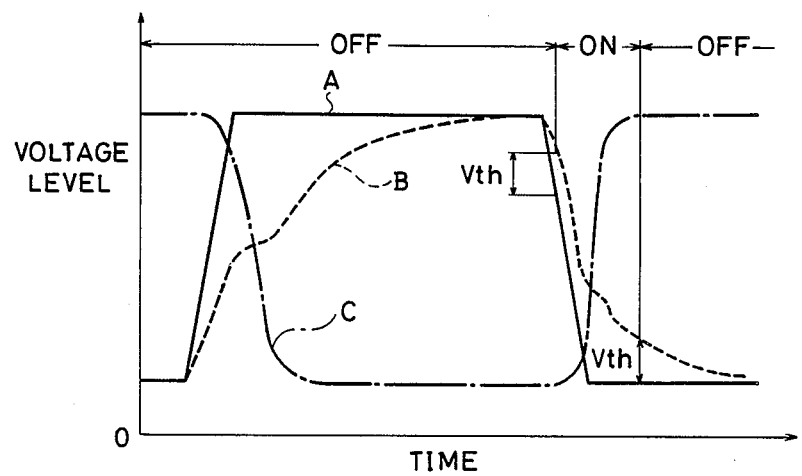
FIG. 12 is a waveform diagram for explaining operation of the inverter circuit shown in FIG. 11.

FIG. 11 is a circuit diagram showing a inverter circuit according to a second embodiment of the present invention, and FIG. 12 is a waveform diagram for explaining operation thereof. The inverter circuit shown in FIG. 11 is the same as the inverter circuit shown in FIG. 9 except that the n channel MOS transistor Q3 shown in FIG. 9 is replaced with a p channel MOS transistor Q4.

In the circuit shown in FIG. 11, the bypassing transistor Q4 is turned on only during a time period when the condition Vin2>Vth+Vin1 is satisfied in the falling portion of an input signal. More specifically, the p channel MOS transistor Q4 is turned on only in a section represented by "ON" in FIG. 12. Thus, in the rising portion of the input signal, a resistor 2 is not bypassed, so that the rising portion of a signal Vin2 becomes slower due to a time constant of an RC circuit, as in FIG. 2 of a waveform diagram showing the conventional inverter circuit. Thus, the falling portion of a signal Vout (represented by a dash and dot line C) is delayed. In addition, while the transistor Q4 is on, a bypass is formed in parallel with the resistor 2, so that the signal Vin2 (represented by a dotted line B) falls steeply irrespective of the above described time constant. Thus, the signal Vout (represented by a dash and dot line C) rises steeply.

As described in the foregoing, according to the inverter circuit shown in FIG. 11, the falling portion, only, of a waveform of the output signal Vout can be delayed.

Figure 13:
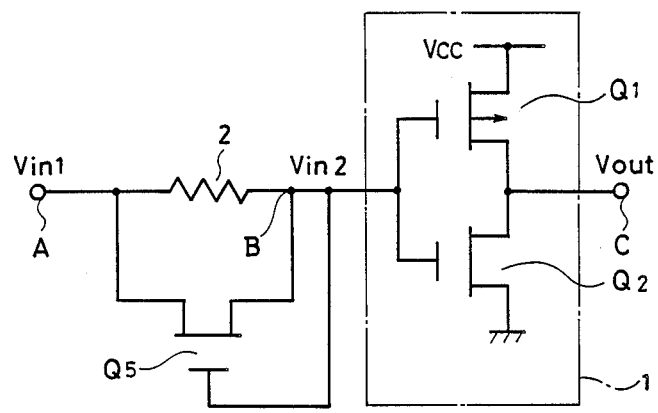
FIG. 13 is a circuit diagram showing an inverter circuit according to a third embodiment of the present invention.
Figure 14:
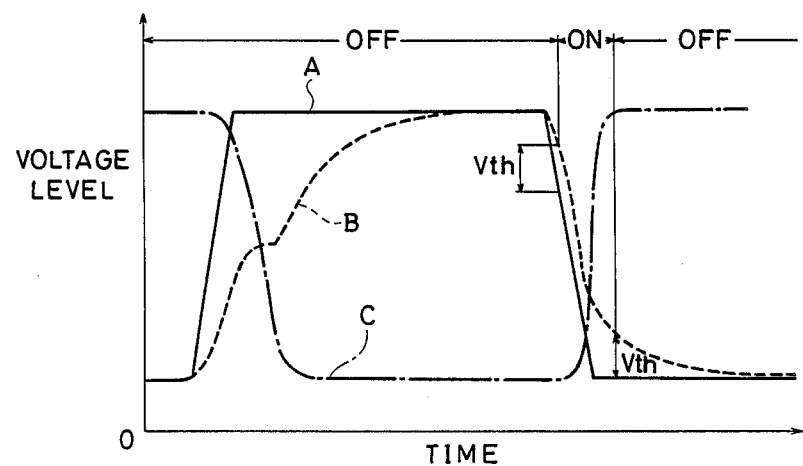
FIG. 14 is a waveform diagram for explaining operation of the inverter circuit shown in FIG. 13.

FIG. 13 is a circuit diagram showing an inverter circuit according to a third embodiment of the present invention, and FIG. 14 is a waveform diagram for explaining operation thereof. The inverter circuit shown in FIG. 13 is the same as the inverter circuit shown in FIG. 9 except that an n channel MOS transistor Q5 has a gate connected to not an input terminal A but a node B.

In the circuit shown in FIG. 13, the bypassing transistor Q5 is turned on only during a time period when the condition Vin2>Vth+Vin1 is satisfied in the falling portion of an input signal. More specifically, only in a section represented by "ON" in FIG. 14, the n channel MOS transistor Q5 is turned on. Thus, in the rising portion of the input signal, a resistor 2 is not bypassed, so that the rising portion of the signal Vin2 becomes slower due to a time constant of an RC circuit, as in FIG. 2 of a waveform diagram showing the conventional inverter circuit. Thus, the falling portion of an output signal Vout (represented by a dash and dot line C) is delayed. In addition, while the transistor Q5 is on, a bypass is formed in parallel with the resistor 2, so that the signal Vin2 (represented by a dotted line B) falls steeply irrespective of the above described time constant. Thus, the output signal Vout (represented by a dash and dot line C) rises steeply.

As described in the foregoing, according to the inverter circuit shown in FIG. 13, the falling portion, only, of a waveform of the output signal Vout can be delayed.

Figure 15:
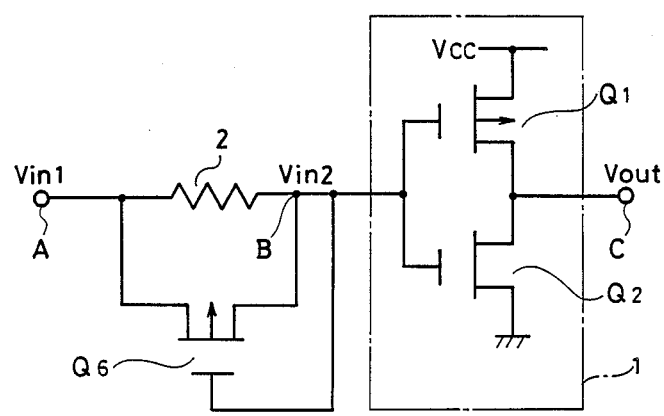
FIG. 15 is a circuit diagram showing an inverter circuit according to a fourth embodiment of the present invention.
Figure 16:
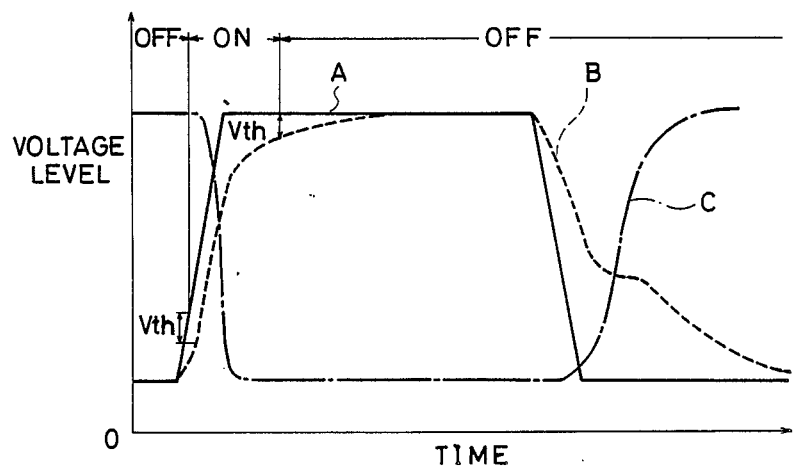
FIG. 16 is a waveform diagram for explaining operation of the inverter circuit shown in FIG. 15.

FIG. 15 is a circuit diagram showing an inverter circuit according to a fourth embodiment of the present invention, and FIG. 16 is a waveform diagram for explaining operation thereof. The inverter circuit shown in FIG. 15 is the same as the inverter circuit shown in FIG. 11 except that a p channel MOS transistor Q6 has a gate connected to not an input terminal A but a node B.

In the circuit shown in FIG. 15, the bypassing transistor Q6 is turned on only during a time period when the condition Vin1>Vth+Vin2 is satisfied during the rising portion of an input signal. More specifically, only in a section represented by "ON" in FIG. 16, the p channel MOS transistor Q6 is turned on. While the transistor Q6 is on, a bypass is formed in parallel with a resistor 2, a signal Vin2 (represented by a dotted line B) rises steeply irrespective of the above described time constant. Thus, an output signal Vout (represented by a dash and dot line C) falls steeply. In addition, in the falling portion of the input signal, no bypass of the resistor 2 is formed, so that the falling portion of the signal Vin2 becomes slower due to the time constant of the RC circuit, as in the waveform diagram FIG. 2 showing the output of a conventional inverter circuit. Thus, only the rising portion of the output signal Vout (represented by a dash and dot line C) is delayed.

Figure 17:
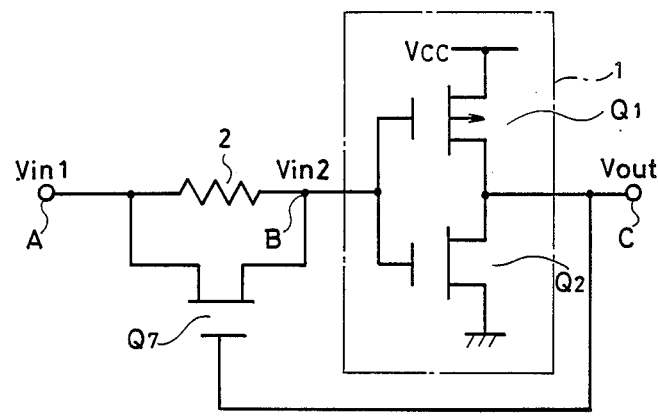
FIG. 17 is a circuit diagram showing an inverter circuit according to a fifth embodiment of the present invention.
Figure 18:
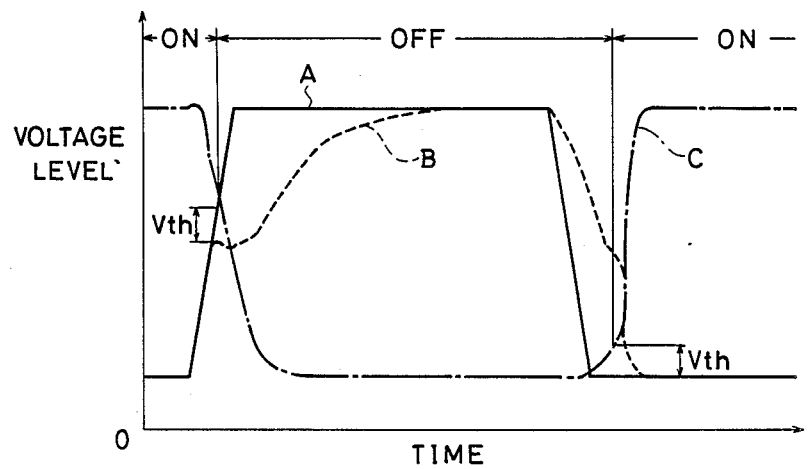
FIG. 18 is a waveform diagram for explaining operation of the inverter circuit shown in FIG. 17.

FIG. 17 is a circuit diagram showing an inverter circuit according to a fifth embodiment of the present invention, and FIG. 18 is a waveform diagram for explaining operation thereof. The inverter circuit shown in FIG. 17 is the same as the inverter circuit shown in FIG. 9 except that an n channel MOS transistor Q7 has a gate connected to not an input terminal A but an output terminal C.

In the circuit shown in FIG. 17, the bypassing transistor Q7 is turned on only during a time period when the condition Vout>Vth+Vin2 is satisfied in the rising portion of an input signal and only during a time period when the condition Vout>Vth+Vin1 is satisfied in the falling portion of the input signal. More specifically, only in sections represented by "ON" in FIG. 18, the n channel MOS transistor Q7 is turned on so that a bypass is formed in parallel with a resistor 2. As seen from FIG. 18, the n channel MOS transistor Q7 remains in the off state until the falling portion of the input signal Vin1 is completed. Therefore, a signal Vin2 (represented by a dotted line B) rises steeply irrespective of the above described time constant, in the first half of the rising portion of the input signal Vin1. Thus, during this "ON" time period, an output signal Vout (represented by a dash and dot line C) falls steeply. In the "OFF" section, the resistor 2 is not bypassed, so that the rising portion and the falling portion of the signal Vin2 become slower due to the time constant of the RC circuit, as in FIG. 2 of a waveform diagram showing the conventional inverter circuit.

As described in the foregoing, according to the inverter circuit shown in FIG. 17, of only timing for the rise of the output signal Vout can be delayed without delaying timing for the fall thereof.

Figure 19:
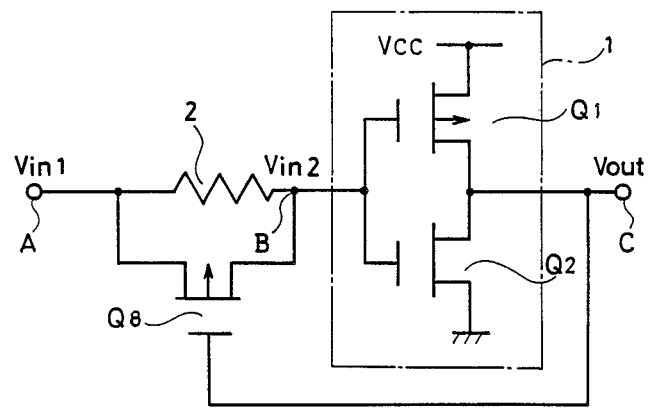
FIG. 19 is a circuit diagram showing an inverter circuit according to a sixth embodiment of the present invention.
Figure 20:
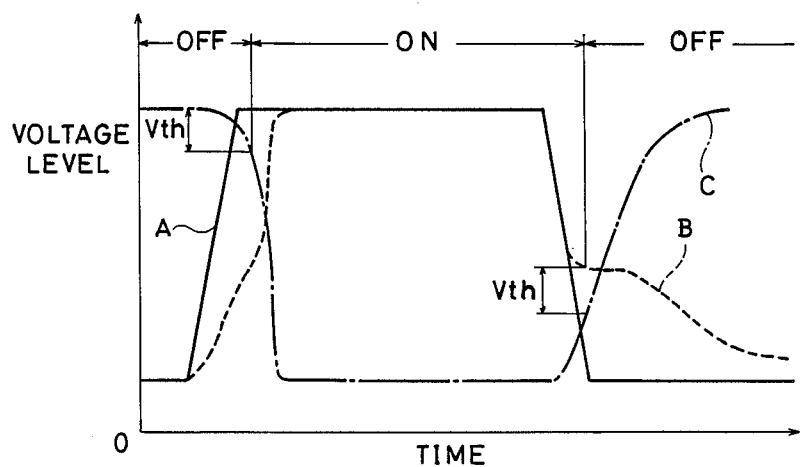
FIG. 20 is a waveform diagram for explaining operation of the inverter circuit shown in FIG. 19.

FIG. 19 is a circuit diagram showing an inverter circuit according to a sixth embodiment of the present invention, and FIG. 20 is a waveform diagram for explaining operation thereof. The inverter circuit shown in FIG. 19 is the same as that shown in FIG. 11 except that a p channel MOS transistor Q8 has a gate connected to not an input terminal A but an output terminal C.

In the circuit shown in FIG. 19, the bypassing transistor Q8 is turned on only during a time period when the condition Vin1>Vth+Vout is satisfied in the rising portion of an input signal and only during a time period when the condition Vin2>Vth+Vout is satisfied in the falling portion of the input signal. More specifically, only in a section represented by "ON" in FIG. 20, the p channel MOS transistor Q8 is turned on so that a bypass is formed in parallel with a resistor 2. As seen from FIG. 20, the p channel MOS transistor Q8 remains in the off state till the rising portion of the input signal Vin1 is completed and then remains in the on state till the falling portion of the input signal Vin1 is completed. Therefore, a signal Vin2 (represented by a dotted line B) falls steeply irrespective of the above described time constant, in the falling portion of the input signal Vin1. Thus, during this "ON" time period, an output signal Vout (represented by a dash and dot line C) rises steeply. In the "OFF" section, the resistor 2 is not bypassed, so that the rising portion and the falling portion of the signal Vin2 become slower due to the time constant of the RC circuit, as in FIG. 2 of a waveform diagram showing the conventional inverter circuit.

As described in the foregoing, according to the inverter circuit shown in FIG. 19, timing of only the fall of the output signal Vout can be delayed without delaying timing for the rise thereof.

Figure 21:
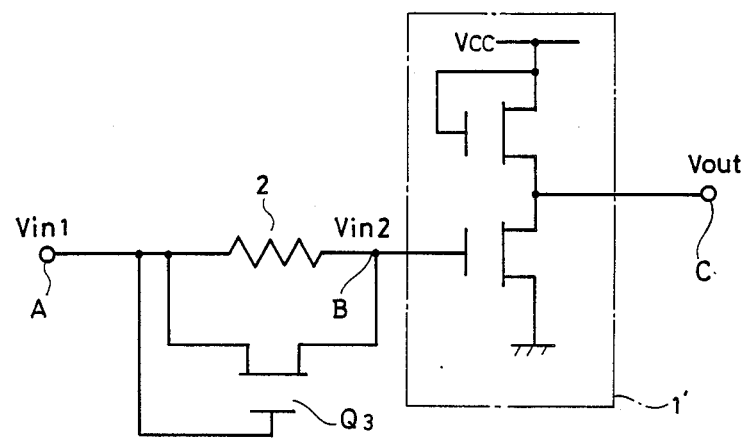
FIGS. 21, 22 and 23 are circuit diagrams each showing still other embodiments of the present invention.
Figure 22:
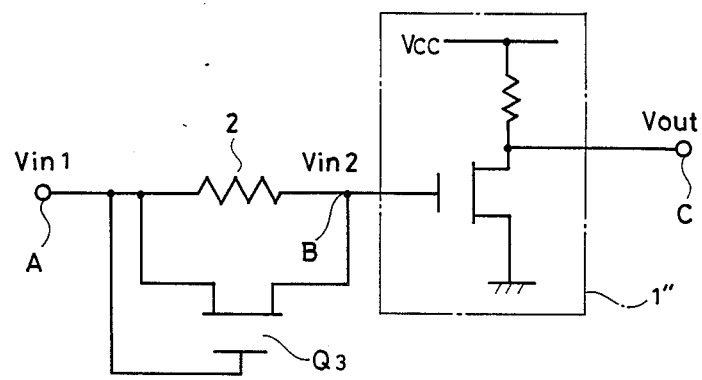

Although in the above described embodiment, a case was described in which a CMOS inverter is employed, it is not intended to be limited to the CMOS inverter. The present invention may be applied to n channel MOS inverters of different types 1' and 1'' shown in FIGS. 21 and 22, respectively, in which case the same effect can be obtained.

Figure 23:
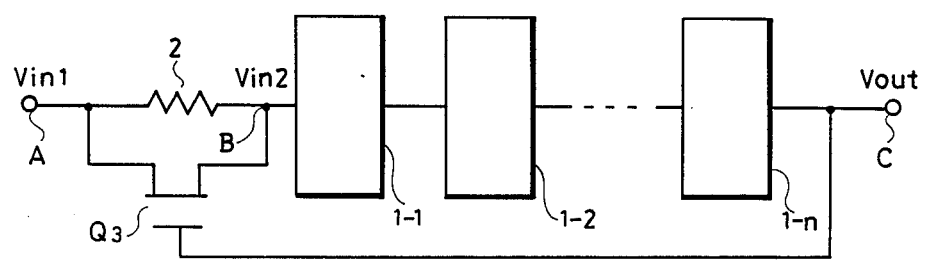

Additionally, it is not intended to be limited to an inverter having one stage. As shown in FIG. 23, the present invention can be applied to inverter means having n stages (1—1, 1-2, —, 1-n) connected in series.

According to the above described embodiments, only one of the rising portion and the falling portion of a waveform of output of an inverter circuit, which is desired to delay, can be delayed.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. An inverter circuit comprising:
   inverter means having an input terminal and an output terminal,
   means for supplying an input signal,
   input resistor means connected between said input signal supplying means and the input terminal of said inverter means, and
   MIS transistor means having first and second conduction terminals connected to both ends of said input resistor means, respectively, and a control terminal connected to the output terminal of said inverter means for selectively bypassing said input resistor means so that either of the leading edge and the trailing edge of a signal outputted from the output terminal of said inverter means is controlled.

2. An inverter circuit according to claim 1, wherein said MIS transistor means comprises an n channel MOS transistor for delaying the trailing edge of the signal outputted from the output terminal of said inverter means.

3. An inverter circuit according to claim 1, wherein said MIS transistor means comprises a p channel MOS transistor for delaying the leading edge of the signal outputted from the output terminal of said inverter means.

4. An inverter circuit according to claim 1, wherein said inverter means comprises a complimentary MOS inverter.

5. An inverter circuit according to claim 1, wherein said inverter means comprises an n channel MOS inverter.

6. An inverter circuit according to claim 1, wherein said inverter means comprises a plurality of inverters connected in series.

* * * * *